United States Patent
Obara et al.

(10) Patent No.: US 9,181,081 B2
(45) Date of Patent: Nov. 10, 2015

(54) ELECTRICAL COMPONENT AND METHOD OF MANUFACTURING THE SAME

(71) Applicant: KABUSHIKI KAISHA TOSHIBA, Minato-ku, Tokyo (JP)

(72) Inventors: Kei Obara, Kawasaki (JP); Yoshiaki Sugizaki, Fujisawa (JP); Yoshiaki Shimooka, Sagamihara (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 146 days.

(21) Appl. No.: 13/962,892

(22) Filed: Aug. 8, 2013

(65) Prior Publication Data

US 2014/0284729 A1    Sep. 25, 2014

(30) Foreign Application Priority Data

Mar. 22, 2013 (JP) .................................. 2013-060652

(51) Int. Cl.
*H01L 29/84* (2006.01)
*B81B 7/00* (2006.01)

(52) U.S. Cl.
CPC ............. *B81B 7/0051* (2013.01); *B81B 7/0032* (2013.01); *B81B 7/0035* (2013.01); *B81B 7/0038* (2013.01); *B81C 2201/0167* (2013.01); *B81C 2203/0136* (2013.01)

(58) Field of Classification Search
CPC ...................... B81B 2201/0221; B81B 7/0032; B81B 7/0035; B81B 7/0038; B81C 1/00476; B81C 1/00333
See application file for complete search history.

(56) References Cited

U.S. PATENT DOCUMENTS

| | | | |
|---|---|---|---|
| 2007/0082507 A1 | 4/2007 | Iyer et al. | |
| 2008/0188025 A1 | 8/2008 | Nakamura | |
| 2009/0075415 A1 | 3/2009 | Nakamura | |
| 2009/0188709 A1 | 7/2009 | Kojima et al. | |
| 2011/0095382 A1 | 4/2011 | Shimooka | |
| 2012/0049390 A1* | 3/2012 | Shimooka et al. | 257/790 |
| 2012/0194496 A1* | 8/2012 | Zhong et al. | 345/211 |
| 2013/0032386 A1 | 2/2013 | Kojima et al. | |

FOREIGN PATENT DOCUMENTS

| | | |
|---|---|---|
| JP | 2004106232 A | 4/2004 |
| JP | 2007222990 A | 9/2007 |
| JP | 2009072845 A | 4/2009 |
| JP | 2010-166620 A | 7/2010 |
| JP | 2010204029 A | 9/2010 |
| JP | 2011082483 A | 4/2011 |
| TW | 200721271 A | 6/2007 |

OTHER PUBLICATIONS

Taiwanese Office Action dated Apr. 9, 2015 (and English translation thereof), issued in counterpart Taiwanese Application No. 102128471.
Japanese Office Action (and English translation thereof) dated Jun. 16, 2015, issued in counterpart Japanese Application No. 2013-060652.

* cited by examiner

*Primary Examiner* — Ha Tran T Nguyen
*Assistant Examiner* — Aaron Dehne
(74) *Attorney, Agent, or Firm* — Holtz, Holtz, Goodman & Chick PC

(57) ABSTRACT

According to one embodiment, an electrical component comprises a substrate, a functional element formed on the substrate, a first layer which includes through holes, and forms a cavity that stores the functional element on the substrate, and a second layer which is formed on the first layer, and closes the through holes. The first layer includes a first film, a second film on the first film, and a third film on the second film. A Young's modulus of the second film is higher than a Young's modulus of the first film and the third film.

17 Claims, 5 Drawing Sheets

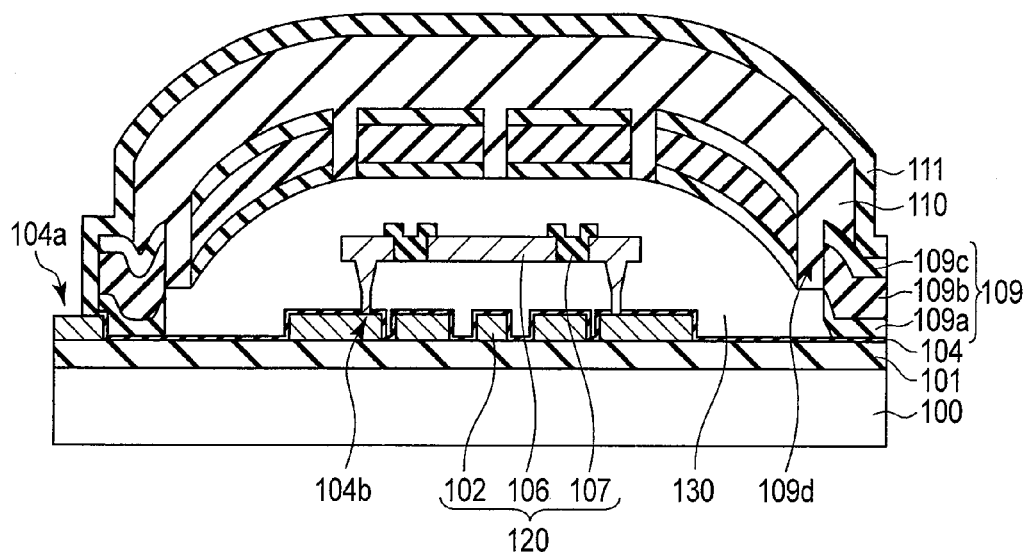
F I G. 1
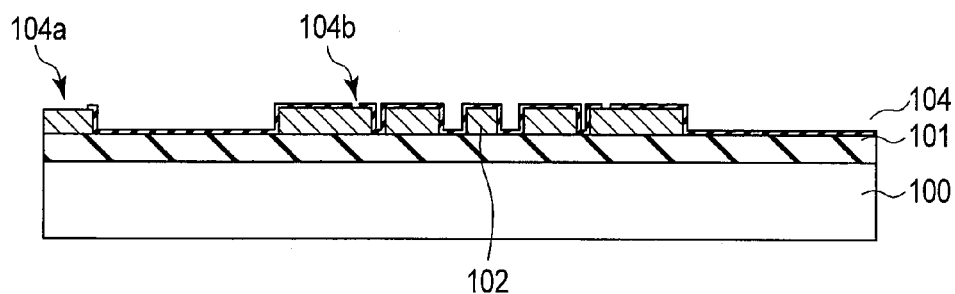
F I G. 2
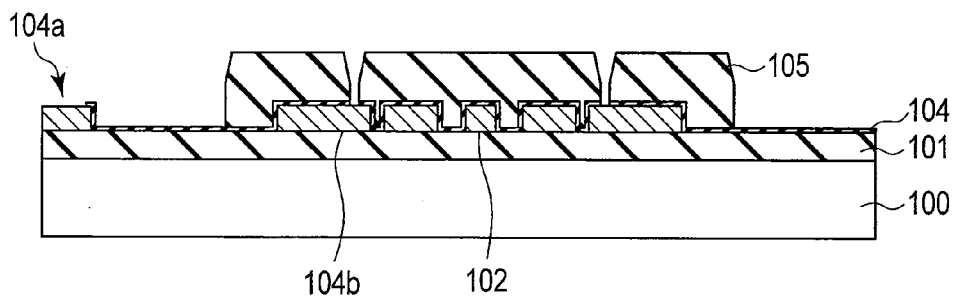
F I G. 3

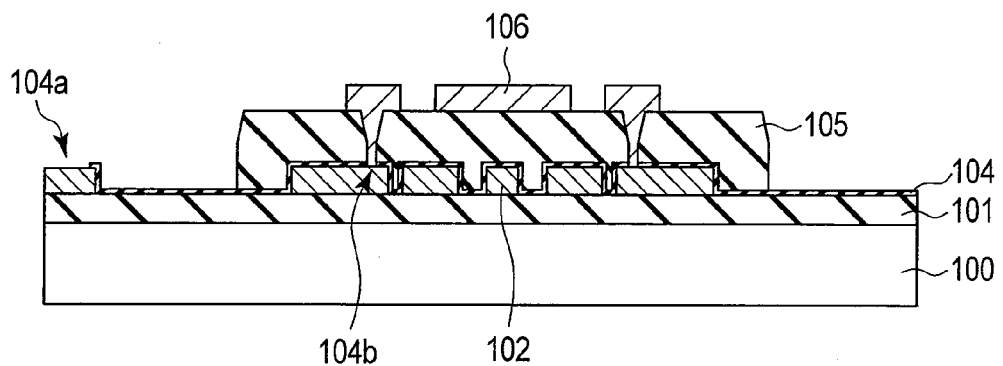
F I G. 4
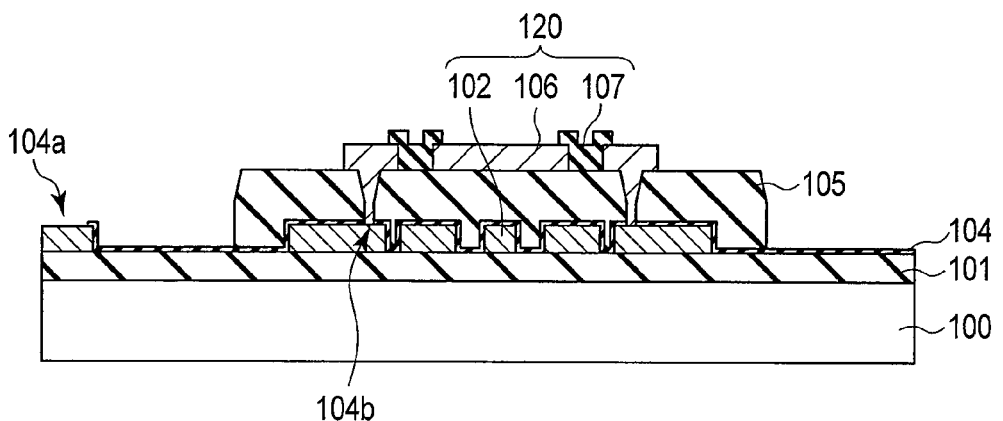
F I G. 5
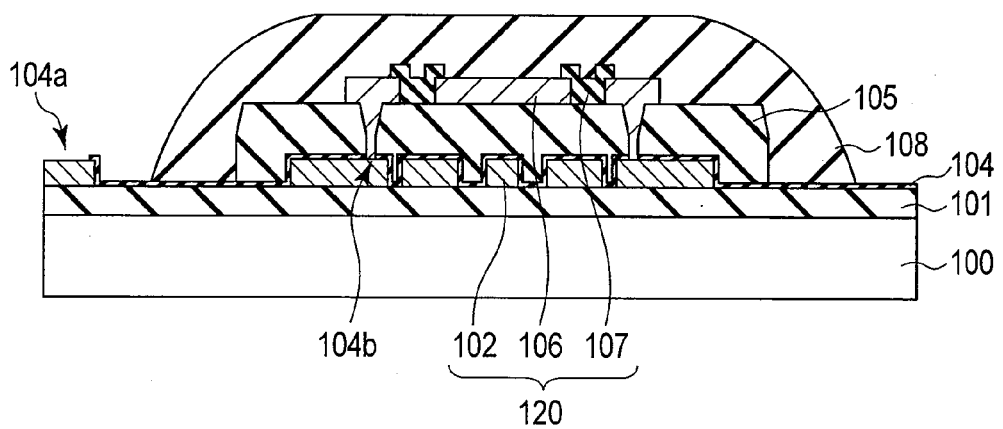
F I G. 6

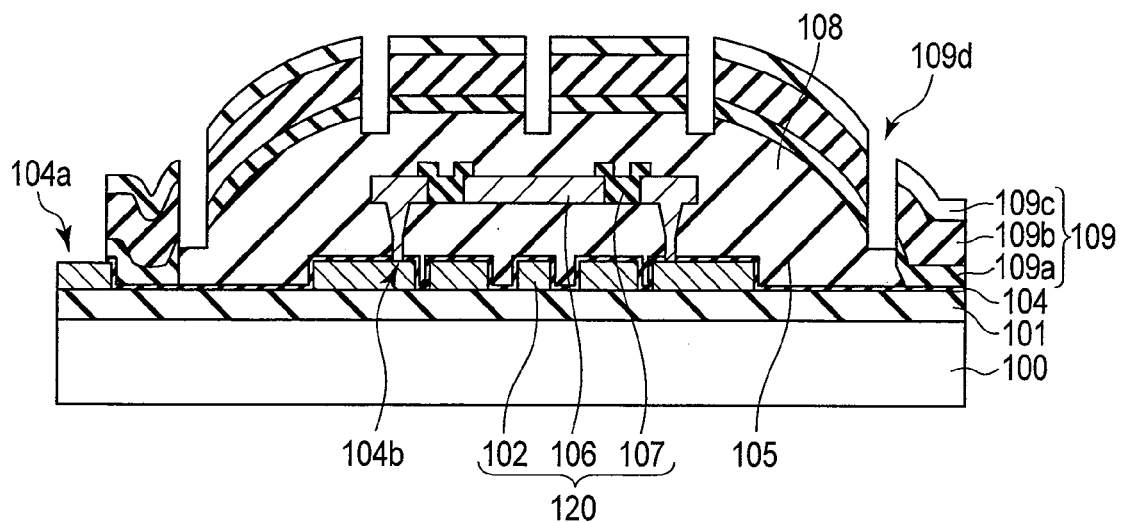
F I G. 7
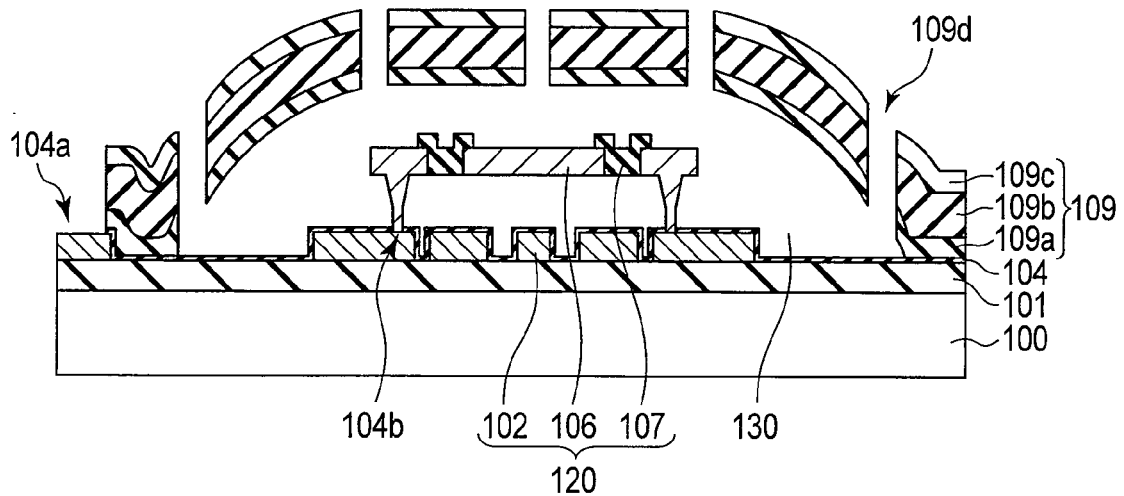
F I G. 8

(a)

(b)

ELECTRICAL COMPONENT AND METHOD OF MANUFACTURING THE SAME

CROSS-REFERENCE TO RELATED APPLICATIONS

This application is based upon and claims the benefit of priority from Japanese Patent Application No. 2013-060652, filed Mar. 22, 2013, the entire contents of which are incorporated herein by reference.

FIELD

Embodiments described herein relate generally to an electrical component and a method of manufacturing the same.

BACKGROUND

A feature of a MEMS (Micro Electro Mechanical Systems) device lies in that it has a mechanically movable portion, unlike a normal semiconductor device. Therefore, packaging a MEMS device requires a cavity serving as the operation space of the mechanically movable portion. That is, a packaging technique/package for forming a hollow structure is used in the MEMS device.

On the other hand, for miniaturization and cost reduction, a packaging technique of forming a hollow structure in a wafer state, instead of individual packaging for each chip, has been proposed in recent years. This packaging technique is called a WLP (Wafer Level Package). Alternatively, this package can be fabricated in a clean room, and is therefore also called an in-line WLP, thin-film cap, or thin-film dome structure.

There is provided a method of manufacturing a MEMS element having a movable portion, and a thin-film dome structure which stores the MEMS element, that includes the step of forming and patterning a first sacrificing layer, the step of forming a MEMS element on the first sacrificing layer, the step of forming a second sacrificing layer on the first sacrificing layer and MEMS element, and patterning it, the step of forming a first layer on the second sacrificing layer, and the step of removing the first sacrificing layer and second sacrificing layer. The first layer partially forms the thin-film dome structure, and has through holes. An undoped silicon oxide film which has a thickness of about 1 μm and is deposited by the CVD (Chemical Vapor Deposition) method, for example, is used as the first layer.

However, when a crack is locally generated in the thin-film dome structure, it becomes the starting point of a path which connects the interior and exterior of the thin-film dome to each other. This may degrade the sealing performance of the dome interior, thus degrading the reliability of the device.

BRIEF DESCRIPTION OF THE DRAWINGS

FIG. 1 is a sectional view showing the structure of an electrical component according to this embodiment;

FIGS. 2 to 9 are sectional views showing the steps of manufacturing an electrical component according to this embodiment.

DETAILED DESCRIPTION

Figure 9:
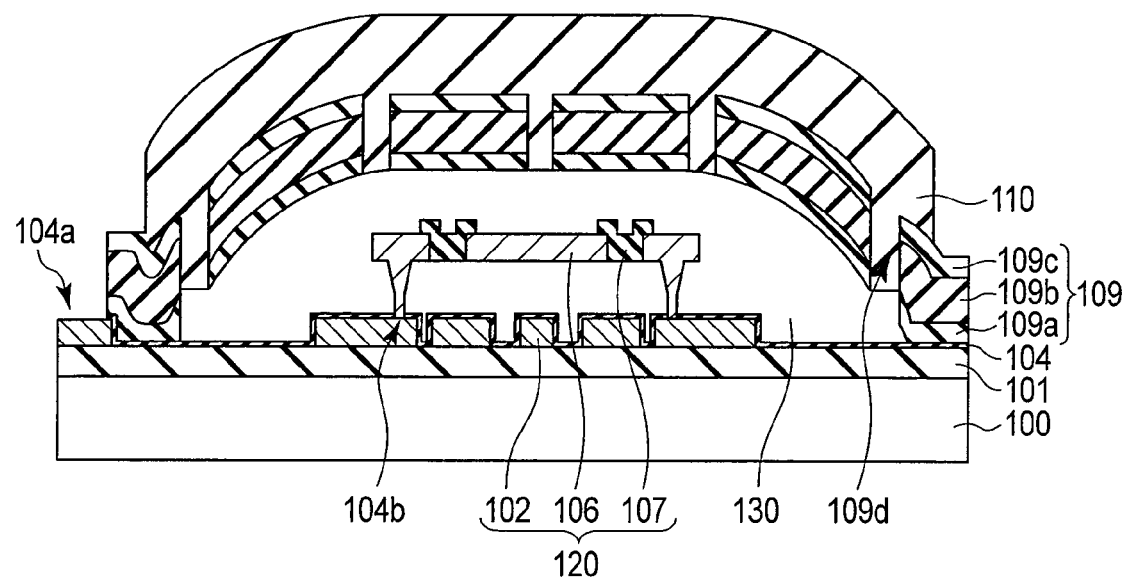

In general, according to one embodiment, an electrical component comprises a substrate, a functional element formed on the substrate, a first layer which includes through holes, and forms a cavity that stores the functional element on the substrate, and a second layer which is formed on the first layer, and closes the through holes. The first layer includes a first film, a second film on the first film, and a third film on the second film. A Young's modulus of the second film is higher than a Young's modulus of the first film and the third film.

A silicon oxide film which forms the first layer as part of a thin-film dome has a relatively low Young's modulus and low mechanical strength. Also, the first layer has the through holes and is therefore desirably formed to have a relatively small thickness. Moreover, the first layer is the innermost layer of the thin-film dome structure and therefore has a small radius of curvature and surface area. Hence, when the first layer is formed as a single-layered silicon oxide film, it considerably deforms due, for example, to a stress generated in a subsequent process. When this occurs, a crack is generated at the stress concentration position of the first layer. At this time, when the first layer has a tensile stress, a crack is more easily generated.

In contrast, in this embodiment, the first layer is formed by a stacked layer having a compressive stress to solve the above-mentioned problem.

Embodiments will be described below with reference to the accompanying drawings. In these drawings, the same reference numerals denote the same parts.

Embodiment

An electrical component according to this embodiment will be described with reference to FIGS. 1 to 10. This embodiment provides an example in which a first layer 109 having through holes 109d as part of a thin-film dome is formed by a stacked film including a first film 109a, second film 109b, and third film 109c, and the first film 109a and third film 109c have a compressive stress, while the second film 109b has a tensile stress. This makes it possible to suppress generation of a crack in the first layer 109. This embodiment will be described in detail below.

Structure According to Embodiment

FIG. 1 is a sectional view showing the structure of an electrical component according to this embodiment.

The electrical component according to this embodiment includes a functional element 120 formed on a substrate 100, and the first layer 109, a second layer 110, and a third layer 111 which form a thin-film dome, as shown in FIG. 1.

The substrate 100 is, for example, a silicon substrate. An insulating layer 101 constituted by, for example, a silicon oxide film ($SiO_X$ film) is formed on the substrate 100. The functional element 120 is formed on the insulating layer 101. The functional element 120 is, for example, an electrostatic driving MEMS variable capacitor.

The functional element 120 is formed by a first metal interconnection 102, a second metal interconnection 106 opposed to the first metal interconnection 102, and an insulator connecting portion 107 which connects second metal interconnections 106 to each other. The first metal interconnection 102 and second metal interconnection 106 are formed by, for example, aluminum. The insulator connecting portion 107 is formed by, for example, a silicon nitride film (SiN film). When a voltage is applied across the first metal interconnection 102 and the second metal interconnection 106, the distance between the first metal interconnection 102 and the second metal interconnection 106 changes due to an electrostatic attractive force, so the capacitance of the functional element 120 changes.

A passivation film 104 constituted by, for example, an $SiO_X$ film or an SiN film is formed on the first metal interconnection 102. The passivation film 104 has openings in a pad portion 104a and a connecting hole portion 104b. The pad portion 104a is formed outside the third layer 111 (to be described later), and electrically connected to an external electrode (not shown). That is, the functional element 120 is electrically connected to the external electrode via the pad portion 104a. Also, in the connecting hole portion 104b, the first metal interconnection 102 and second metal interconnection 106 are electrically connected to each other.

The functional element 120 is formed in a cavity 130. The cavity 130 is a region to ensure the operating space of the functional element 120. The interior of the cavity 130 is maintained in a dry atmosphere or a vacuum atmosphere. This prevents deterioration of the first metal interconnection 102 and second metal interconnection 106 formed by aluminum due to a toxic gas such as moisture, and, in turn, prevents degradation in property of a MEMS variable capacitor.

The first layer 109 forms the cavity 130 which stores the functional element 120, and has a plurality of through holes (openings) 109d. The plurality of through holes 109d in the first layer 109 serve to, after the functional element 120 is formed, remove a sacrificing layer (to be described later) by etching to form the cavity 130. That is, the sacrificing layer is etched through the through holes 109d.

The first layer 109 will be described in detail later.

The second layer 110 is formed on the first layer 109 to close the plurality of through holes 109d. The second layer 110 has a function of passing and discharging a toxic gas in the cavity 130 to the outside while sealing the cavity 130 to adjust the atmosphere in the cavity 130.

The second layer 110 is desirably formed by a coating film of an organic material such as polyimide. This makes it possible to easily, reliably seal the through holes 109d even if the size (diameter or opening area) of the through holes 109d is large. With this operation, the size or arrangement of the through holes 109d is not limited. Therefore, by arranging a plurality of through holes 109d with a large size, a sacrificing layer (to be described later) can be reliably etched in a short time.

Note that the second layer 110 is not limited to a coating film of an organic material, and may be formed by an insulating film such as an $SiO_X$ film or an SiN film.

The third layer 111 is formed on the second layer 110. The third layer 111 functions as a moisture-proof film which prevents moisture in the air from permeating the second layer 110 and entering the cavity 130. The third layer 111 is formed by, for example, an insulating film such as an SiN film.

The first layer 109, second layer 110, and third layer 111 function as a thin-film dome for protecting the functional element 120 from the outside.

The first layer 109 in this embodiment will be described below.

The first layer 109 in this embodiment is formed by a stacked film of the first film 109a in the lower layer, the second film 109b in the middle layer, and the third film 109c in the upper layer. In other words, the first film 109a is formed on the innermost side of the thin-film dome to form the cavity 130. The second film 109b is formed on the first film 109a. The third film 109c is formed on the second film 109b.

Note that the first film 109a and third film 109c have a compressive stress. This makes it possible to suppress generation of a crack in the first layer 109. On the other hand, the second film 109b has a tensile stress. This makes it possible to suppress generation of warpage of the entire substrate 100 (wafer) due to a compressive stress acting on the first film 109a and third film 109c. Note that the second film 109b need not have a tensile stress. The second film 109b need not have a stress (tensile stress and compressive stress), or may have a compressive stress lower than that acting on the first film 109a and third film 109c. Such a stress acting on the first film 109a, second film 109b, and third film 109c can be appropriately controlled by a manufacturing method (to be described later).

Also, the first film 109a and third film 109c are formed by, for example, $SiO_X$ films, and the second film 109b is formed by, for example, an SiN film. That is, the second film 109b (SiN film) has a Young's modulus higher than that of the first film 109a and third film 109c ($SiO_X$ films). This makes it possible to increase the mechanical strength of the first layer 109.

Also, in a manufacturing process (to be described later), the first film 109a and third film 109c ($SiO_X$ films) have an etching selectivity higher than the second film 109b (SiN film) for the sacrificing layer. This makes it possible to facilitate the step of removing a sacrificing layer.

Manufacturing Method According to Embodiment

FIGS. 2 to 9 are sectional views showing the steps of manufacturing an electrical component according to this embodiment. Also, FIG. 10 is a sectional view showing a stress acting on each layer in forming a first layer 109 according to this embodiment. The step of forming a MEMS element to the step of forming a thin-film dome at a wafer level in an electrical component according to this embodiment will be described below.

First, as shown in FIG. 2, in the step of forming a MEMS element, an insulating layer 101 constituted by, for example, an $SiO_X$ film is formed on the substrate 100. A first metal interconnection 102 formed by, for example, aluminum is formed on the insulating layer 101 and patterned. The first metal interconnection 102 is formed to have a thickness of, for example, several hundred nanometers to several micrometers. The sputtering method, for example, is used as a method of depositing the first metal interconnection 102. Also, as a patterning method, the conventional photolithography or RIE (Reactive Ion Etching) method, for example, may be used, or the photolithography and wet etching methods may be used. Note that an insulating layer 101 need not be formed, and, in this case, a first metal interconnection 102 is directly formed on the substrate 100.

A passivation film 104 constituted by, for example, an $SiO_X$ film or an SiN film is formed on the entire surface. As a method of depositing the passivation film 104, the CVD (Chemical Vapor Deposition) method, for example, is used. The passivation film 104 is formed to have a thickness of, for example, several hundred nanometers to several micrometers. The passivation film 104 is patterned to form openings in the pad portion 104a and connecting hole portion 104b. That is, the first metal interconnection 102 of the pad portion 104a and connecting hole portion 104b is exposed. As a method of patterning the passivation film 104, the photolithography or RIE method, for example, is used.

A first sacrificing layer 105 formed by an organic material such as polyimide is applied to cover the first metal interconnection 102, as shown in FIG. 3. The first sacrificing layer 105 is formed to have a thickness of, for example, several hundred nanometers to several micrometers.

The first sacrificing layer 105 is patterned in a desired shape. With this operation, the first metal interconnection 102 of the pad portion 104a and connecting hole portion 104b is exposed. The first sacrificing layer 105 may be patterned by light exposure and development. Alternatively, the first sacrificing layer 105 may be patterned using the RIE method and a resist pattern (not shown) formed on it using the normal lithography method. Again, an $SiO_X$ film (not shown) formed on the first sacrificing layer 105, for example, may be patterned into a hard mask using the RIE or wet etching method and a resist pattern using the normal lithography method, and the first sacrificing layer 105 may be patterned using the hard mask.

A second metal interconnection 106 constituted by, for example, aluminum is formed on the first sacrificing layer 105 and patterned, as shown in FIG. 4. The second metal interconnection 106 is formed to have a thickness of, for example, several hundred nanometers to several micrometers. With this operation, the second metal interconnection 106 is connected to the first metal interconnection 102 of the exposed connecting hole portion 104b. The sputtering method is used as a method of depositing the second metal interconnection 106. Also, as a patterning method, the conventional photolithography or RIE (Reactive Ion Etching) method, for example, may be used, or the photolithography and wet etching methods may be used.

An insulator connecting portion 107 constituted by, for example, an SiN film is formed between second metal interconnections 106 and patterned, as shown in FIG. 5. The insulator connecting portion 107 is formed to have a thickness of, for example, several hundred nanometers to several micrometers. With this operation, the second metal interconnections 106 are connected to each other. As a depositing method and method of patterning the insulator connecting portion 107, the conventional semiconductor technique is used. A functional element 120 is thus completed as a movable portion.

A second sacrificing layer 108 formed by an organic material such as polyimide is applied to cover the functional element 120 and first sacrificing layer 105 in the step of forming a thin-film dome at a wafer level, as shown in FIG. 6. The second sacrificing layer 108 is formed to have a thickness of, for example, several hundred nanometers to several micrometers.

The second sacrificing layer 108 is patterned in a desired shape. The second sacrificing layer 108 may be patterned into a light exposure and development. Alternatively, the second sacrificing layer 108 may be patterned using the RIE method and a resist pattern (not shown) formed on it using the normal lithography method. Again, an $SiO_X$ film (not shown) formed on the second sacrificing layer 108, for example, may be patterned into a hard mask using the RIE or wet etching method and a resist pattern using the normal lithography method, and the second sacrificing layer 108 may be patterned using the hard mask.

A first layer 109 including a plurality of through holes 109d is formed with a thickness of, for example, several hundred nanometers to several micrometers to cover the second sacrificing layer 108, as shown in FIG. 7.

More specifically, first, a first film 109a is formed as the lower layer of the first layer 109 to cover the second sacrificing layer 108. The first film 109a is formed by an $SiO_X$ film. The CVD method is used as a method of depositing the first film 109a. At this time, the first film 109a is formed to have, for example, neither a compressive stress nor a tensile stress. The compressive stress and tensile stress can be controlled by adjusting the gas flow ratio of a deposition gas and/or the pressure in deposition in the CVD method. A compressive stress can be formed by decreasing the pressure in deposition, and a tensile stress can be formed by increasing the pressure in deposition.

A second film 109b is formed on the first film 109a as the middle layer of the first layer 109. The second film 109b is constituted by an SiN film. The CVD method is used as a method of depositing the second film 109b. At this time, the second film 109b is formed to have, for example, a tensile stress.

A third film 109c is formed on the second film 109b as the upper layer of the first layer 109. The third film 109c is constituted by an $SiO_X$ film. The CVD method is used as a method of depositing the third film 109c. At this time, the third film 109c is formed to have, for example, neither a compressive stress nor a tensile stress.

At this time, as shown in (a) of FIG. 10, since the second film 109b as the middle layer of the first layer 109 has a tensile stress, a compressive stress acts on the interface between the second film 109b and the first film 109a, and that between the second film 109b and the third film 109c. As a result, as shown in (b) of FIG. 10, a compressive stress acts on the first film 109a and third film 109c in contact with the second film 109b. That is, the first film 109a and third film 109c have a compressive stress, while the second film 109b has a tensile stress.

Note that it is desired to set the thickness of the second film 109b larger than that of the first film 109a and third film 109c. This makes it possible to increase the compressive stress to be applied to the first film 109a and third film 109c by the tensile stress of the second film 109b. Also, the mechanical strength of the first layer 109 can be increased by increasing the thickness of the second film 109b with a high Young's modulus.

Also, it is desired to set the thickness of the third film 109c larger than that of the first film 109a. This makes it possible to increase the influence of the stress of the third film 109c positioned outside, thus forming the first layer 109 in a dome-like convex shape in advance. This, in turn, makes it possible to suppress further doming in a subsequent manufacturing step (the step of forming a third layer 111 (to be described later).

A resist (not shown) is applied onto the third film 109c. A plurality of through holes 109d for removing the first sacrificing layer 105 and second sacrificing layer 108 are formed in the first layer 109 (first film 109a, second film 109b, and third film 109c) using the RIE or wet etching method and a resist pattern (not shown) formed using the normal lithography method.

At this time, the through hole 109d desirably has a size that gradually increases from the outside to the inside upon adjusting the selection ratio between the resist pattern (not shown) and the first layer 109. In other words, the through hole 109d desirably has a tapered shape with a size that gradually decreases from the outside to the inside. This is done to improve the sealing performance of the through holes 109d after the first sacrificing layer 105 and second sacrificing layer 108 (to be described later) are removed.

With this operation, a first layer 109 having a plurality of through holes 109d is formed to include a first film 109a and third film 109c which are positioned on the back surface (lower surface) and front surface (upper surface) and have a compressive stress, and a second film 109b which is positioned between them and has a tensile stress.

Although the second film 109b has a tensile stress to apply a compressive stress to the first film 109a and third film 109c in the above description, the present embodiment is not limited to this. In forming the first film 109a and third film 109c, they may be formed to have a compressive stress in advance.

In this case, the second film 109b need not have a tensile stress, or may have a compressive stress lower than that acting on the first film 109a and third film 109c.

As shown in FIG. 8, by ashing using, for example, $O_2$ gas and $CF_4$, the resist pattern (not shown), first sacrificing layer 105, and second sacrificing layer 108 are removed. With this operation, the functional element 120 is released to form a cavity 130 as the operating space of the functional element 120.

At this time, a first film 109a and third film 109c which are positioned on the back and front surfaces, respectively, and have large exposed surfaces are formed by $SiO_X$ films. An $SiO_X$ film has an etching selectivity to the first sacrificing layer 105 and second sacrificing layer 108, which is higher than that of an SiN film. This makes it possible to easily remove the first sacrificing layer 105 and second sacrificing layer 108.

Figure 10:
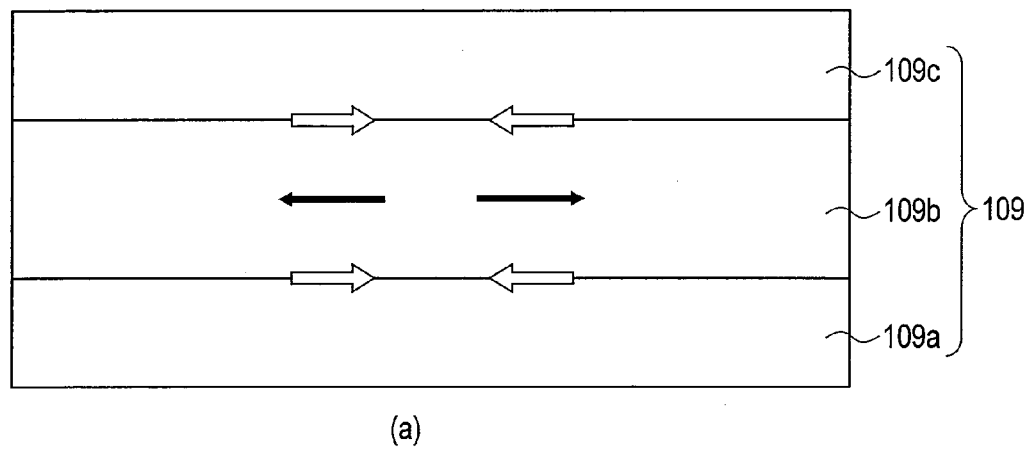
FIG. 10 shows sectional views of a stress acting on each layer in forming a first layer according to this embodiment.
Figure 10:
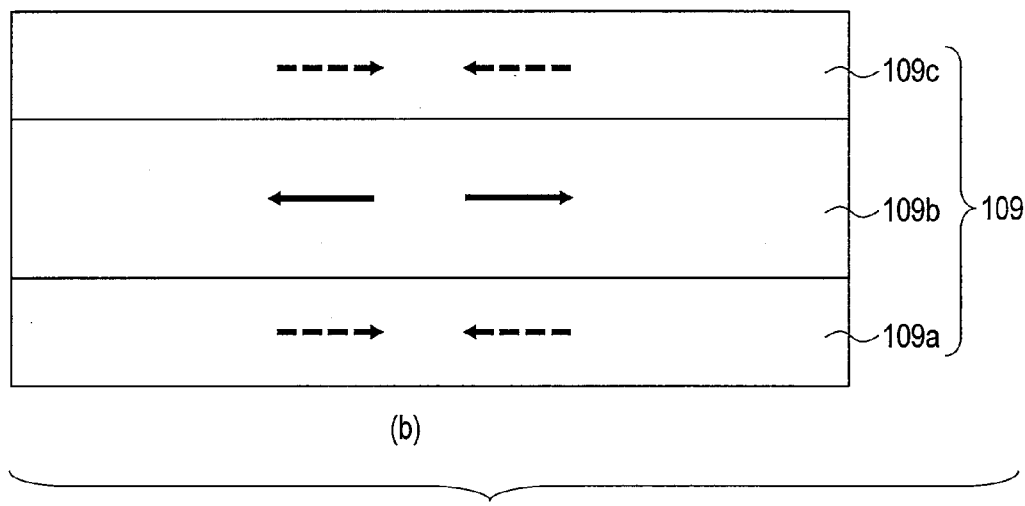

A second layer 110 is formed on the first layer 109, as shown in FIG. 9. With this operation, the plurality of through holes 109d are closed to seal the cavity 130. The second layer 110 is formed to have a thickness of, for example, several hundred nanometers to several micrometers. The second layer 110 is formed by a coating film of an organic material such as polyimide, an SiN film, or an $SiO_X$ film.

A third layer 111 is formed on the second layer 110 as a moisture-proof film, as shown in FIG. 1. The third layer 111 is formed to have a thickness of, for example, several hundred nanometers to several micrometers. The third layer 111 is formed by, for example, an SiN film. The CVD method is used as a method of depositing the third layer 111.

The third layer 111 is formed to have a relatively large thickness. Also, the third layer 111 is decompressed and heated in forming it. Therefore, upon formation of the third layer 111, a high stress is generated to expand the first layer 109. At this time, a crack may be generated when the first layer 109 has a tensile stress.

In contrast to this, in this embodiment, a first film 109a and third film 109c having a compressive stress are formed as the lower and upper layers of the first layer 109. This makes it possible to suppress generation of a crack in the first layer 109. Also, a second film 109b with a high Young's modulus is formed as the middle layer of the first layer 109. This makes it possible to reduce deformation of the first layer 109 due to a stress acting in forming the third layer 111, thus more reliably suppressing generation of a crack.

The third layer 111 is patterned in a desired shape. The third layer 111 is patterned using the RIE or wet etching method and a resist pattern (not shown) formed using the normal lithography method. A thin-film dome of a WLP is thus completed.

Effect According to this Embodiment

According to this embodiment described above, a first layer 109 having through holes is formed by a stacked film including a first film 109a, second film 109b, and third film 109c. Of the first layer 109, the first film 109a and third film 109c positioned on the back surface (lower surface) and front surface (upper surface) have a compressive stress. This makes it possible to suppress generation of a crack on the back and front surfaces of the first layer 109.

Also, in this embodiment, the second film 109b, positioned in the middle, of the first layer 109 has a tensile stress. This makes it possible to cancel a compressive stress of the first film 109a and third film 109c. It is therefore possible to suppress generation of warpage in the substrate 100 (wafer) due to the stress of the first film 109a, second film 109b, and third film 109c.

Moreover, in this embodiment, the second film 109b, positioned in the middle, of the first layer 109 is formed by an SiN film with a high Young's modulus. With this arrangement, the mechanical strength of the first layer 109 increases. This makes it possible to suppress deformation of the first layer 109, thus more reliably suppressing generation of a crack.

Again, in this embodiment, the first film 109a and third film 109c, positioned on the back surface (lower surface) and front surface (upper surface), respectively, of the first layer 109 are formed by $SiO_X$ films. That is, the first film 109a and third film 109c having large exposed surfaces in removing a sacrificing layer are formed by $SiO_X$ films with high etching resistance. In other words, the first film 109a and third film 109c function as a protective layer for an SiN film (second film 109b) with low etching resistance. This makes it possible to sufficiently increase the etching selectivity between the sacrificing layer and the first layer 109 in removing the sacrificing layer, thus easily removing only the sacrificing layer. Also, as the middle layer (second film 109b) of the first layer 109, materials with high Young's moduli can be widely selected without taking into consideration the etching selectivity.

Note that the materials that form the first layer 109 (first film 109a, second film 109b, and third film 109c) are not limited to the above-mentioned materials, depending on the need of the mechanical strength or etching selectivity in the first layer 109.

For example, all of the first film 109a, second film 109b, and third film 109c may be formed by $SiO_X$ films. This makes it possible to more reliably increase the etching selectivity between the sacrificing layer and the first layer 109 in the step of removing the sacrificing layer. More specifically, the etching resistance of the side surface of the second film 109b to be exposed in the through holes 109d can also be increased.

On the other hand, all of the first film 109a, second film 109b, and third film 109c may be formed by SiN films. This makes it possible to increase the Young's modulus of the entire first layer 109, thus more reliably increasing the mechanical strength of the first layer 109.

Also, forming the first film 109a, second film 109b, and third film 109c using the same material obviates the need to change the type of gas in formation. This makes it possible to facilitate a process of forming the first layer 109.

Moreover, the present embodiment is not limited to the above-mentioned materials, and the first film 109a, second film 109b, and third film 109c may be formed by a silicon oxynitride film (SiON film).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electrical component comprising:
  a substrate;
  a functional element formed on the substrate;
  a first layer which includes through holes and which forms a cavity that stores the functional element on the substrate; and a second layer which is formed on the first layer and which closes the through holes, wherein the first layer covers the functional element and includes a first film, a second film provided on the first film, and a third film provided on the second film, and a Young's modulus of the second film is higher than a Young's modulus of each of the first film and the third film, and wherein a thickness of the second film is larger than a thickness of each of the first film and the third film.

2. The component of claim 1, wherein the first film and the third film each have a compressive stress higher than a compressive stress of the second film.

3. The component of claim 2, wherein the second film has a tensile stress.

4. The component of claim 3, wherein each of the first film and the third film comprises a $SiO_X$ film, and the second film comprises a SiN film.

5. The component of claim 1, wherein the thickness of the third film is larger than the thickness of the first film.

6. An electrical component comprising:
a substrate;
a functional element formed on the substrate;
a first layer which includes through holes and which forms a cavity that stores the functional element on the substrate; and
a second layer which is formed on the first layer and which closes the through holes,
wherein the first layer covers the functional element and includes a first film, a second film provided on the first film, and a third film provided on the second film, and the first film and the third film each have a compressive stress higher than a compressive stress of the second film, and
wherein a thickness of the second film is larger than a thickness of each of the first film and the third film.

7. The component of claim 6, wherein the second film has a tensile stress.

8. The component of claim 6, wherein a Young's modulus of the second film is higher than a Young's modulus of each of the first film and the third film.

9. The component of claim 6, wherein each of the first film and the third film comprises a $SiO_X$ film, and the second film comprises a SiN film.

10. The component of claim 6, wherein the thickness of the third film is larger than the thickness of the first film.

11. A method of manufacturing an electrical component, the method comprising:

forming a functional element on a substrate;
forming a sacrificing layer to cover the functional element;
forming a first layer on the sacrificing layer;
forming through holes in the first layer;
removing the sacrificing layer through the through holes to form a cavity that stores the functional element on the substrate; and
forming a second layer that closes the through holes on the first layer,
wherein the first layer covers the functional element and includes a first film, a second film provided on the first film, and a third film provided on the second film, and the first film and the third film each have a compressive stress higher than a compressive stress of the second film, and
wherein a thickness of the second film is larger than a thickness of each of the first film and the third film.

12. The method of claim 11, wherein the forming the first layer comprises:
forming the first film with neither a compressive stress nor a tensile stress on the sacrificing layer;
forming the second film with a tensile stress on the first film; and
forming the third film with neither a compressive stress nor a tensile stress on the second film.

13. The method of claim 11, wherein the forming the first layer comprises:
forming the first film with a compressive stress on the sacrificing layer;
forming, on the first film, the second film with a tensile stress, with neither a tensile stress nor a compressive stress, or with a compressive stress lower than a compressive stress of the first film; and
forming, on the second film, the third film with a compressive stress equal to a compressive stress of the first film.

14. The method of claim 11, wherein in the removing the sacrificing layer, an etching selectivity of each of the first film and the third film is lower than an etching selectivity of the second film.

15. The method of claim 11, wherein a Young's modulus of the second film is higher than a Young's modulus of each of the first film and the third film.

16. The method of claim 11, wherein each of the first film and the third film comprises a $SiO_X$ film, and the second film includes a SiN film.

17. The method of claim 11, wherein the thickness of the third film is larger than the thickness of the first film.

* * * * *